(12) United States Patent
Tan et al.

(10) Patent No.: US 9,401,473 B2
(45) Date of Patent: Jul. 26, 2016

(54) COMPACT RRAM STRUCTURE WITH CONTACT-LESS UNIT CELL

(71) Applicant: GLOBALFOUNDRIES Singapore Pte. Ltd., Singapore (SG)

(72) Inventors: Shyue Seng Tan, Singapore (SG); Eng Huat Toh, Singapore (SG); Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 178 days.

(21) Appl. No.: 13/682,661

(22) Filed: Nov. 20, 2012

(65) Prior Publication Data

US 2014/0138603 A1 May 22, 2014

(51) Int. Cl.
*H01L 45/00* (2006.01)
*H01L 27/24* (2006.01)

(52) U.S. Cl.
CPC ............ *H01L 45/04* (2013.01); *H01L 27/2409* (2013.01); *H01L 27/2463* (2013.01); *H01L 45/1233* (2013.01); *H01L 45/146* (2013.01); *H01L 45/147* (2013.01); *H01L 45/1675* (2013.01)

(58) Field of Classification Search
CPC .................................................. H01L 27/2463
See application file for complete search history.

(56) References Cited

U.S. PATENT DOCUMENTS

| 2006/0177947 | A1  | 8/2006 | Yoshida et al. |       |
|--------------|-----|--------|----------------|-------|
| 2007/0165434 | A1  | 7/2007 | Lee et al.     |       |
| 2009/0008623 | A1* | 1/2009 | Lim et al.     | 257/4 |
| 2009/0184396 | A1  | 7/2009 | Kim et al.     |       |
| 2010/0155689 | A1* | 6/2010 | Scheuerlein    | H01L 27/2409 257/5 |
| 2011/0193048 | A1* | 8/2011 | Oh et al.      | 257/3 |
| 2013/0126822 | A1* | 5/2013 | Pellizzer      | H01L 45/1233 257/5 |
| 2014/0042382 | A1* | 2/2014 | Lung           | H01L 27/2463 257/4 |

OTHER PUBLICATIONS

Yuan Heng Tseng et al., High Density and Ultra Small Cell Size of Contact ReRAM (CR-RAM) in 90nm CMOS Logic Technology and Circuits, IEDM09-109, 2009, pp. 5.6.1-5.6.4, Taiwan.
Pi-Feng Chiu et al., A Low Store Energy, Low VDDmin, Nonvolatile 8T2R SRAM with 3D Stacked RRAM Devices for Low Power Mobile Applications, 2010 Symposium on VLSI Circuits/Technical Digest of Technical Papers, 2010, pp. 229-230, Taiwan.
Z. Wei et al., Highly Reliable TaOx ReRAM and Direct Evidence of Redox Reaction Mechanism, IEEE, 2008, pp. 293-296, Japan.
K. Tsunoda et al., Low Power and High Speed Switching of Ti-doped NiO ReRAM under the Unipolar Voltage Source of less than 3 V, IEEE, 2007, pp. 767-770, Japan.
I. G. Baek et al., Multi-layer Cross-point Binary Oxide Resistive Memory (OxRRAM) for Post-NAND Storage Application, IEEE, 2005, 4 pages, Korea.
Myoung-Jae Lee et al., 2-stack 1D-1R Cross-point Structure with Oxide Diodes as Switch Elements for High Density Resistance RAM applications, IEEE, 2007, pp. 771-774, Korea.
Yuan Zhang et al., An Integrated Phase Change Memory Cell With Ge Nanowire Diode for Cross-Point Memory, 2007 Symposium on VLSI Technology Digest of Technical Papers, 2007, pp. 98-99, 6B-2, U.S.A.
Eric Yeow Hwee Teo et al., An Organic-Based Diode-Memory Device With Rectifying Property for Crossbar Memory Array Applications, IEEE Electron Device Letters, May 2009, pp. 487-489, vol. 30, No. 5, Singapore.

* cited by examiner

*Primary Examiner* — Kimberly Rizkallah
*Assistant Examiner* — Mounir Amer
(74) *Attorney, Agent, or Firm* — Horizon IP Pte. Ltd.

(57) ABSTRACT

A RRAM device having a diode device structure coupled to a variable resistance layer is disclosed. The diode device structure can either be embedded into or fabricated over the substrate. A memory device having an array of said RRAM devices can be fabricated with multiple common bit lines and common word lines.

20 Claims, 15 Drawing Sheets

COMPACT RRAM STRUCTURE WITH CONTACT-LESS UNIT CELL

BACKGROUND OF THE INVENTION

The present disclosure generally relates to sophisticated semiconductor devices and the manufacturing of such devices, and, more specifically, to a compact RRAM (Resistance Random Access Memory) device with an embedded Si-diode structure and various methods of making such an RRAM device.

DESCRIPTION OF THE RELATED ART

As is well known, non-volatile memory (NVM) devices are characterized in that there are no loss of data stored in their memory cells, even when an external power supply is removed. For that reason, such NVM devices are widely employed in a computer, mobile communications systems, memory cards and the like.

Flash memory structures are generally used in such NVM applications. The typical flash memory device employs memory cells having a stacked gate structure. The stacked gate structure typically includes a tunnel oxide layer, a floating gate, an inter-gate dielectric layer and a control gate electrode, which are sequentially stacked above a channel region. While flash memory structures have enjoyed enormous success, the continued and ever present drive to reduce the size of integrated circuits products has created many challenges for the continued scaling of flash memory devices. Such challenges include scaling of program/erase voltages, access speed, reliability, the number of charges stored per floating gate, etc.

A RRAM device is a NVM device in which a variable resistance material is used as a data storage material layer. The resistance of the variable resistance material layer may be varied or changed based upon the polarity and/or amplitude of an applied electric pulse. The electric field strength or electric current density from the pulse or pulses, is sufficient to switch the physical state of the material so as to modify the properties of the material and establish a highly localized conductive filament in the variable resistance material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity or pulses having a different amplitude from those used to induce the initial damage.

In general, after an RRAM device is initially fabricated, the variable resistance material layer does not exhibit any switching properties. Rather, a high voltage, high current process, a so-called FORMING process, is performed to create the localized conductive filament with oxygen vacancies from the cathode, establishing a low resistance state (LRS) exhibiting a relatively high current flow. A so-called RESET process is performed to break the conductive filament and establish a high resistance state (HRS) exhibiting a relatively low current flow. The RESET process does not remove the entire conductive filament but only removes a small portion of it. After a RESET process is performed, a so-called SET process is performed to re-establish the conductive filament and thus the low resistance state of the RRAM device. The SET process is essentially the same as the FORMING process except that the SET process is performed at a lower voltage than the FORMING process since the filament length to be re-established is shorter than the length of the conductive filament that was formed during the FORMING process.

RRAM devices may be advantageous in highly scaled, high integration applications due to their relatively smaller footprint as compared to a capacitor based memory device in which memory characteristics are proportional to the size of a cell area.

The present disclosure is directed to a compact RRAM device structure with contact-less unit cell, and various methods of making such a RRAM device.

SUMMARY

A memory cell, such as a RRAM device and the method of fabricating thereof, are disclosed. In one embodiment, a memory cell is disclosed. The memory cell includes a substrate. A bottom electrode is disposed on the substrate. A doped layer is disposed on the substrate. The doped layer and bottom electrode form a diode. The memory cell further includes a storage layer and a top electrode. The storage layer is disposed between the top and bottom electrodes on the substrate.

In another embodiment, a RRAM device is presented. The RRAM device includes a substrate with a first and second diffusion region in an active region. The first diffusion region is formed above the second diffusion region. The first diffusion region is of first polarity type dopants and the second diffusion region is of second polarity type dopants. The first and second diffusion regions formed a diode device and the second diffusion region further includes a conductive word line coupled to said diode device. A variable resistance layer is formed over the surface of the active region and a conductive bit line electrode is formed over the variable resistance layer. The conductive bit line electrode and variable resistance layer are patterned to form a stacked layer with a first side and a second side.

In another embodiment, the RRAM device includes a substrate with a diffusion region in an active region. A variable resistance layer is formed over the surface of the active region. The said diffusion region includes a conductive word line coupled to the variable resistance layer. A conductive bit line electrode is formed over the variable resistance layer. A first semiconductor layer with a first polarity type dopant is formed over a second semiconductor layer with a second polarity type dopant, wherein said second semiconductor layer is formed over said conductive bit line electrode. The said first and said second semiconductor layers formed a diode device wherein said diode device is conductively coupled to said conductive bit line electrode. The said first semiconductor layer, said second semiconductor layer, said conductive bit line electrode and said variable resistance layer are patterned to form a stacked layer with a first side and a second side.

In another embodiment, a memory device includes a substrate with alternate strips of active and isolation regions. A plurality bit line electrodes is formed over the surface of said active and isolation regions. A plurality of RRAM devices is formed, wherein each said RRAM device includes an overlapping region of each said bit line electrode and said active region. A variable resistance layer is positioned in each said overlapping region between said bit line electrode and said active region. Each of said active region further includes a first diffusion region on top of a second diffusion region, wherein said first and second diffusion regions are of opposite polarities type dopants, forms a diode device. The said second diffusion region further includes a conductive word line coupled to said diode device.

In yet another embodiment, a memory device includes a substrate with alternate strips of active and isolation regions. A plurality of bit line electrodes are formed over the surface of said active and isolation regions. A plurality of RRAM devices is formed, wherein each said RRAM device includes an overlapping region of each said bit line electrode and said active region. A variable resistance layer is positioned in each of said overlapping region between said bit line electrode and said active region. Each of said active regions further includes a diffusion region, wherein said diffusion region includes a conductive word line coupled to said variable resistance layer. A first semiconductor layer with first polarity type dopants is formed over a second semiconductor layer with second polarity type dopants, wherein said second semiconductor layer is formed over said bit line electrodes. The said first and second semiconductor layers formed a diode device coupled to the bit line electrode.

In another embodiment, a method for forming a memory cell is disclosed. The method includes providing a substrate. A bottom electrode is formed on the substrate. A doped layer is formed on the bottom electrode. The doped layer and bottom electrode form a diode. The method further includes forming a storage layer on the doped layer and a top electrode on the doped layer.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

The present disclosure is directed to various embodiments of a novel compact RRAM device structure with a coupled diode device and the methods of making such a RRAM device. It will be apparent to those skilled in the art that the disclosed device may be employed with a variety of technologies, e.g., NMOS, PMOS CMOS etc., and may be incorporated in a variety of integrated circuit products.

Other aspects, features and technical effects will also be readily apparent to those skilled in the art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
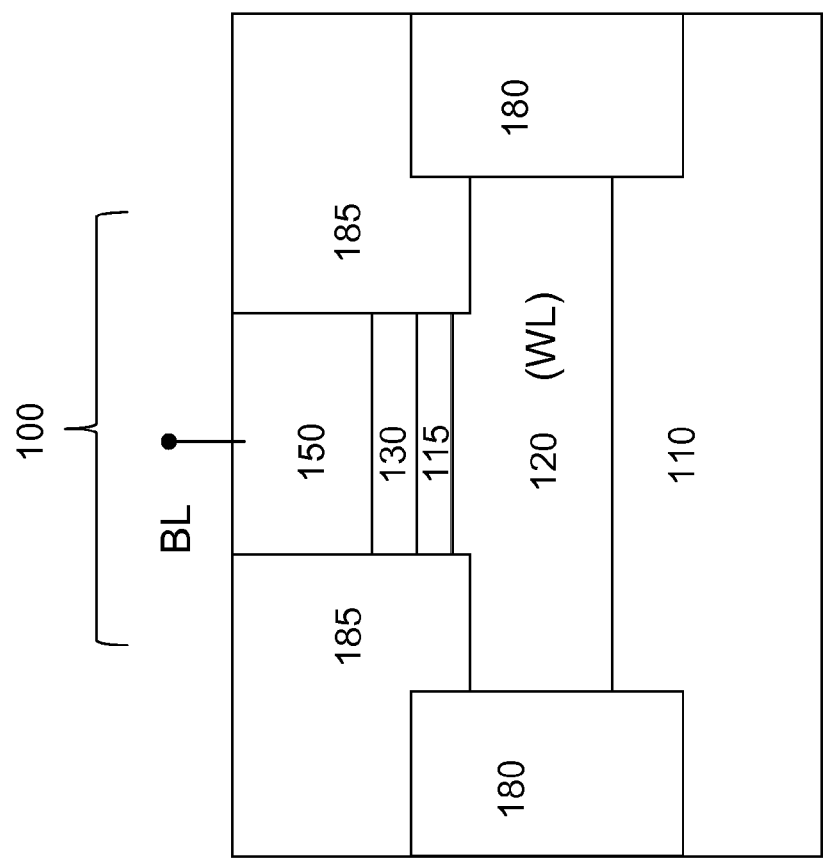
FIGS. 1a and b show the cross-sectional view and circuit diagram of a first embodiment of a RRAM device.
Figure 1B:
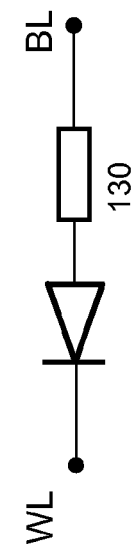

FIG. 1a and FIG. 1b show a cross-sectional view of an embodiment of a RRAM device 100 and its corresponding circuit diagram, respectively. The device, as shown, is formed in and above an active region defined by isolation regions 180 and substrate 110. The substrate, for example, is a semiconductor substrate, such as a silicon substrate. In one embodiment, the substrate includes a p-type doped substrate. The p-type doped substrate may be a lightly doped p-type substrate. Other types of semiconductor substrates, including those which are un-doped or doped with the same or other types of other dopants may also be useful. For example, the substrate may be a lightly doped p-type ($p^-$) or un-doped silicon layer on a heavily doped p-type ($p^+$) bulk or an un-doped or $p^-$ silicon on insulator.

An isolation region may be provided for isolating or separating different regions of the substrate. In one embodiment, the active region is isolated from other regions by an isolation region 180. In one embodiment, the isolation region surrounds the active region. The isolation region, for example, is a shallow trench isolation (STI) region. Other types of isolation regions, such as deep trench isolation (DTI), may also be employed. The STI region, for example, extends to a depth of about 2000 Å-4000 Å. Providing STI regions which extend to other depths may also be useful.

A first diffusion region 115 is disposed in the substrate. In one embodiment, the first diffusion region includes first polarity type dopants. For example, the first polarity type dopants may be a p-type dopant. In one embodiment, the first diffusion region is heavily doped with the first polarity type dopants.

A second diffusion region 120 is disposed in the substrate. In one embodiment, the second diffusion region includes second polarity type dopants. For example, the second polarity type dopants may be a n-type dopant. In one embodiment the first and second diffusion regions form a diode device. The diode device, for example, serves as cell selector for selecting a memory cell for access. The second diffusion region further functions as a conductive word line (WL) or bottom electrode coupled to the said diode device.

A variable resistance layer 130 and a bit line electrode 150 (BL) or top electrode with a first side and a second side are provided on the substrate. The variable resistance layer, for example, serves as a data storage layer. The variable resistance layer is capable of having its resistivity changed in response to an electric signal and the bit line electrode provides the electric signals to the variable resistance layer. In one embodiment, the variable resistance layer is disposed between the first diffusion region and the bit line electrode.

The variable resistance layer may include a material capable of changing its resistivity in response to an electric signal. Such materials may include a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}CaO_{0.3}BaCo_2O_{5+\delta}$. Other possible materials for the variable resistance layer include transition metal oxides such as hafnium oxide, titanium oxide, nickel oxide, tungsten oxide, tantalum oxide, copper oxide, etc., manganites, titanates and zirconates. The bit line electrode, for example, may include titanium, tungsten, platinum and nickel. Other suitable types of materials for the variable resistance layer and the bit line electrode may also be useful. In another embodiment, the variable resistance layer can be sandwiched in between the two metal electrodes with the bottom metal electrode being formed on top of the first diffusion layer 115.

Isolation structures 185 are disposed on the substrate adjacent to said first and second sides. In one embodiment, the isolation structures include a single layer of a dielectric material. For example, the dielectric material may be silicon oxide or silicon nitride. Other types of dielectric materials may also be useful.

Figure 2:
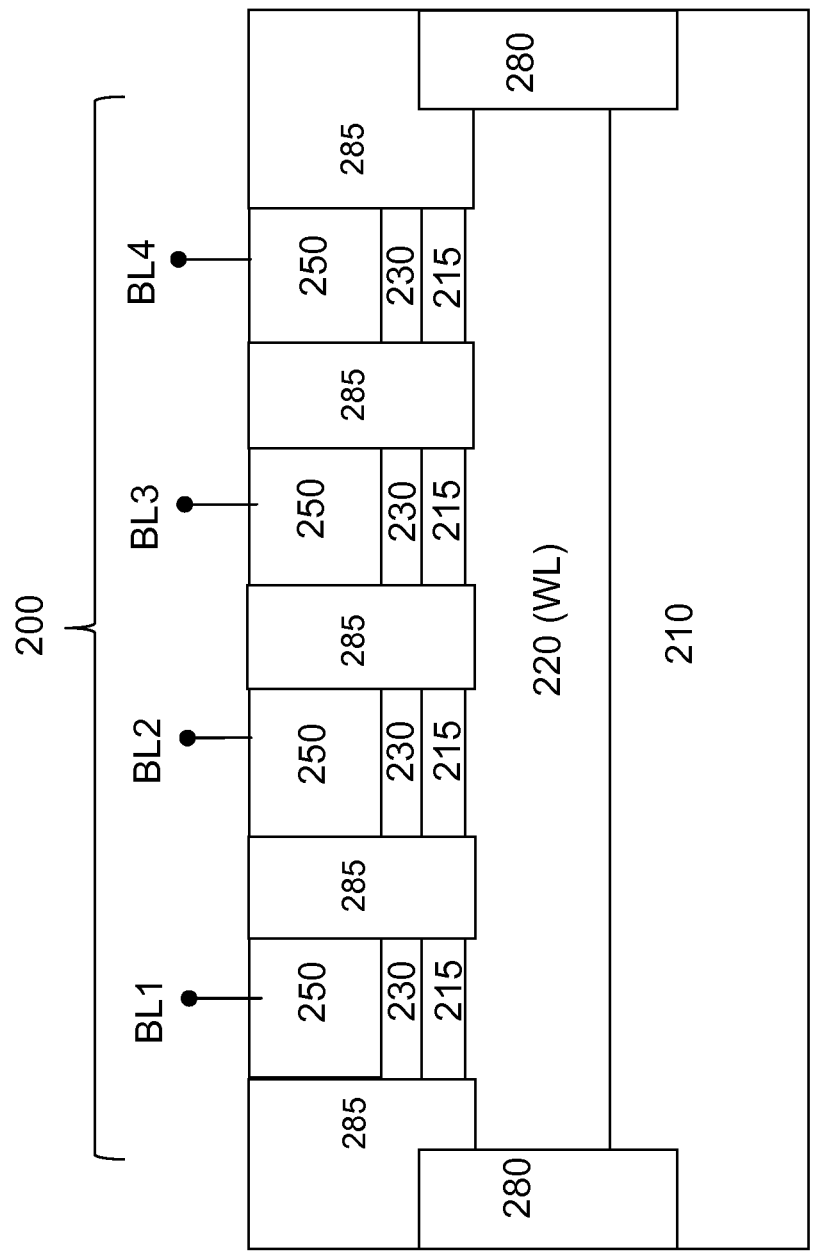
FIG. 2 shows the cross-sectional view of a memory device having a plurality of the RRAM device of the first embodiment.

FIG. 2 shows a cross sectional view of an embodiment of a memory device 200 having a plurality of RRAM devices 100. In one embodiment, the second diffusion region 220 in the active region of the substrate is a conductive word line common to the RRAM devices with corresponding bit line electrodes: BL1, BL2, BL3 and BL4. A wordline forms a row of memory cells and a bitline line forms a column of memory cells. The wordlines and bitlines form rows and columns of memory cells of the array. In the case where the electrodes are directly connected to or serving as wordlines and bitlines, a cross-point memory array is formed.

Isolation structures 285 are disposed between each of the RRAM devices 100, separating or isolating each of the said RRAM devices. In one embodiment, the isolation structures 285 include dielectric materials such as silicon oxide. Other types of dielectric materials may also be employed. The spacing between each RRAM devices, for example, may be of about 1:1 to that of line:space; or even go down to half-pitch scheme 1:0.5 for line:space. Providing a spacing of other widths may also be useful.

Figure 3B:
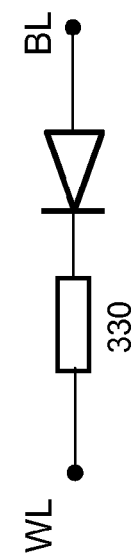
FIGS. 3a and b show the cross-sectional view and circuit diagram of a second embodiment of a RRAM device.
Figure 3A:
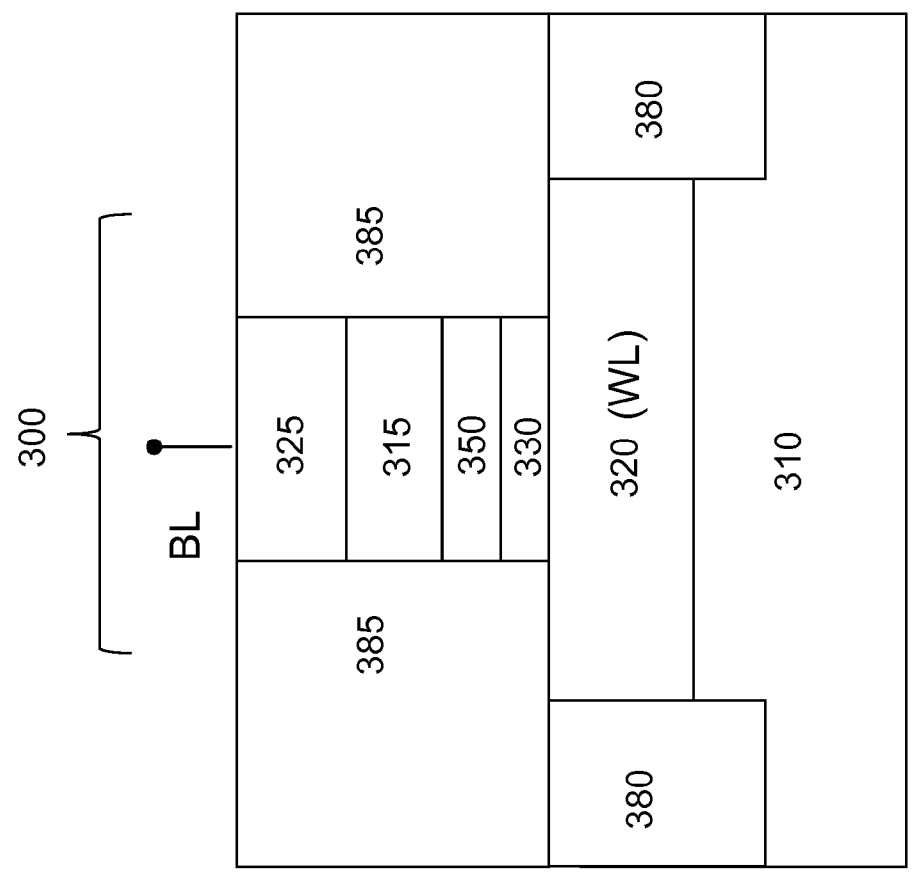

FIG. 3a and FIG. 3b show a cross-sectional view of another embodiment of a RRAM device 300 and its corresponding circuit diagram, respectively. The device, as shown, is formed in and above an active region defined by isolation regions 380 and substrate 310. The substrate, for example, is a semiconductor substrate, such as a silicon substrate. In one embodiment, the substrate includes a p-type doped substrate. The p-type doped substrate may be a lightly doped p-type substrate. Other types of semiconductor substrates, including those which are un-doped or doped with the same or other types of other dopants may also be useful. For example, the substrate may be a lightly doped p-type (p⁻) or un-doped silicon layer on a heavily doped p-type (p⁺) bulk or an un-doped or p⁻ silicon on insulator.

An isolation region may be provided for isolating or separating different regions of the substrate. In one embodiment, the active region is isolated from other regions by an isolation region 380. In one embodiment, the isolation region surrounds the active region. The isolation region, for example, is a shallow trench isolation (STI) region. Other types of isolation region, such as deep trench isolation (DTI), may also be employed. The STI region, for example, extends to a depth of about 2000-4000 Å. Providing STI regions which extend to other depths may also be useful.

A diffusion region 320 is disposed in the substrate. In one embodiment, the diffusion region includes second polarity type dopants. For example, the second polarity type dopants may be a n-type dopant. In one embodiment, the diffusion region 320 functions as a conductive word line.

A variable resistance layer 330 and a bit line electrode 350 are disposed on the substrate. The variable resistance layer is capable of having its resistivity changed in response to an electric signal. In one embodiment, the variable resistance layer is disposed between diffusion region 320 and the bit line electrode 350.

A first semiconductor layer 315 and a second semiconductor layer 325 are disposed over the bit line electrode wherein said first semiconductor layer is disposed between said second semiconductor layer and bit line electrode. In one embodiment, the first semiconductor layer includes first polarity type dopants and the second semiconductor layer includes second polarity type dopants. For example, the first polarity type dopants may be a p-type dopant and the second polarity type dopants may be a n-type dopant. In one embodiment, said first semiconductor layer and second semiconductor layer are heavily doped with their respective dopant types. The coupling of the first and second semiconductor layers forms a diode device. Forming a diode device with the first semiconductor layer of a second polarity type dopants and a second semiconductor layer of a first polarity type dopants may also be useful. Semiconductor layers 315, 325, bit line electrode 350 and variable resistance layer 330 are patterned with a first side and a second side.

Isolation structures 385 are disposed on the substrate adjacent to said first and second sides. In one embodiment, the isolation structures include a single layer of a dielectric material. For example, the dielectric material may be silicon oxide or silicon nitride. Other types of dielectric materials may also be useful.

Figure 4:
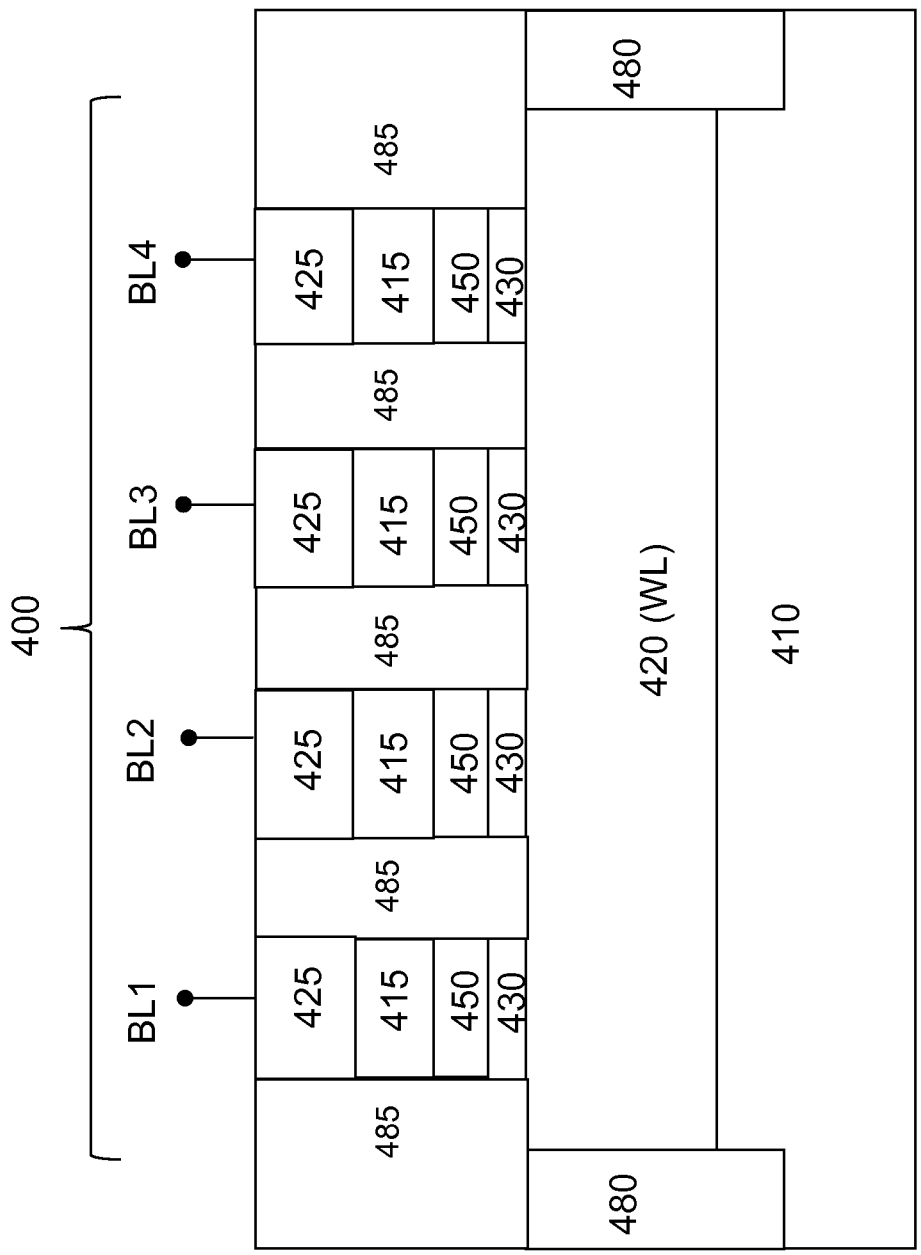
FIG. 4 shows the cross-sectional view of a memory device having a plurality of the RRAM device of the second embodiment.

FIG. 4 shows a cross sectional view of an embodiment of a memory device 400 having a plurality of RRAM devices. In one embodiment, diffusion region 420 in the active region of the substrate is a conductive word line common to the plurality of RRAM devices.

Isolation structures 485 are disposed between each of the RRAM devices 300, separating or isolating each of the said RRAM devices. In one embodiment, the isolation structures 485 include dielectric materials such as silicon oxide. Other types of dielectric materials may also be employed. The spacing between the RRAM devices, for example, may be of about 1:1 to that of line:space; or even go down to half-pitch scheme 1:0.5 for line:space. Providing spacing of other widths may also be useful.

FIGS. 5a-e show cross-sectional views of an embodiment of a process for forming the memory device 200 with a plurality of RRAM devices 100. The process sequence for the fabrication of a memory device with a plurality of RRAM devices is identical to that for a single RRAM device 100.

Figure 5A:
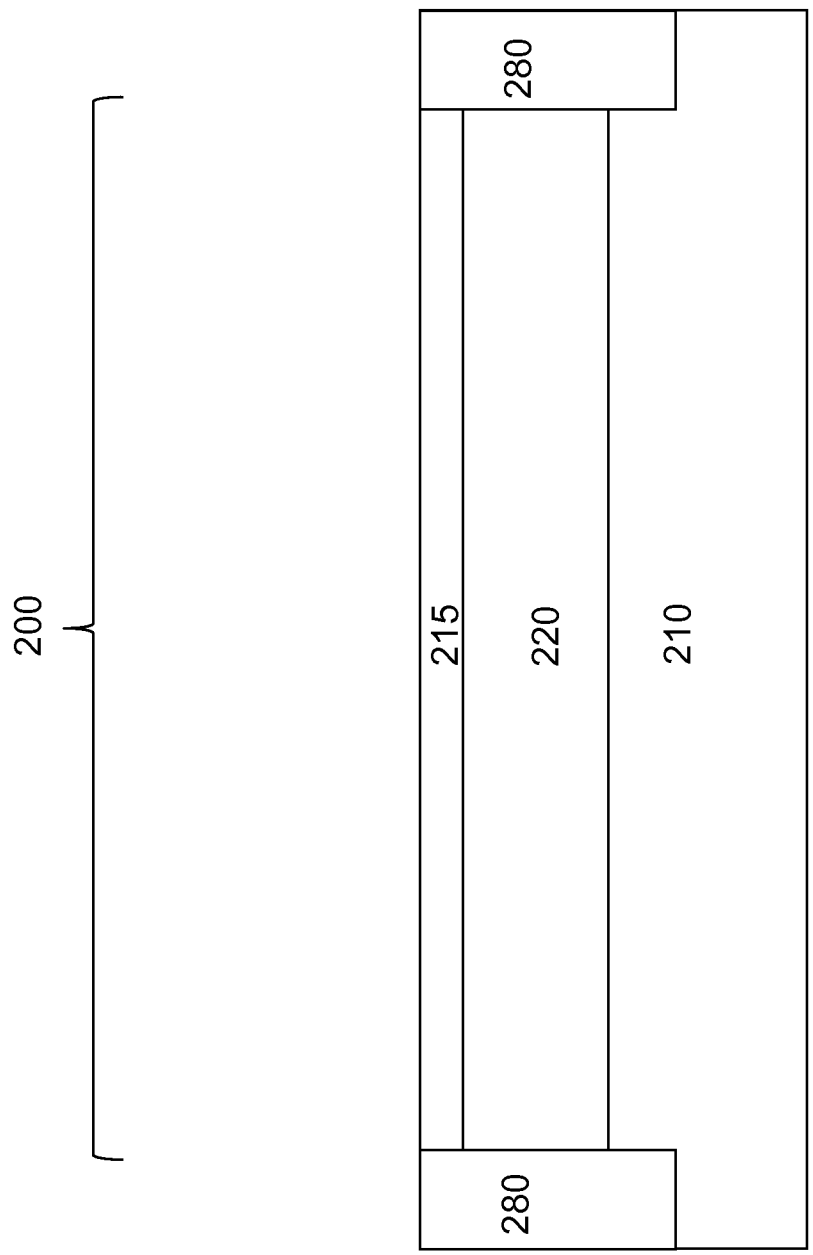
FIGS. 5a-e show the process sequence of the fabrication of a memory device 200 having a plurality of RRAM device 100.

As shown in FIG. 5a, a substrate 210 is provided. The substrate can include a silicon substrate, such as a lightly doped p-type doped substrate. Other types of substrates, including silicon germanium or silicon-on-insulator (SOI) are also useful. Isolation regions 280 are formed in the substrate. The isolation regions include, for example STIs. Various processes can be employed to form the STI regions. For example, the substrate can be etched using etch and mask techniques to form trenches which are then filled with dielectric materials such as silicon oxide. Chemical Mechanical Polishing (CMP) can be performed to remove excess oxide and provide a planar substrate top surface. Other processes or materials can also be used to form the STIs. The isolation may be other types of isolation regions, for example, Deep Trench Isolation (DTI) regions. The depth of the STIs may be, for example, about 2000-4000 Å. Other depths of STIs may also be useful.

A first diffusion region 215 includes the first polarity type and a second diffusion region 220 includes the second polarity type are disposed on the substrate. The depth of the first diffusion region and the second diffusion region, for example, may be in the range of about 0.1-0.5 μm and 0.8-1.8 μm, respectively. Providing a first diffusion region and a second diffusion region having other depths may also be useful.

In one embodiment, the first diffusion region is heavily doped with a p-type dopant and the second diffusion region is doped with a n-type dopant. Forming a first diffusion region heavily doped with a n-type dopant and a second diffusion region doped with a p-type dopant may be useful as well. The first and second diffusion regions may be formed by performing multiple implants at different energies. The first and second diffusion regions may be formed by implantation of dopants, with or without a diffusion implant mask. In one embodiment, the first and second diffusion regions are formed by implantation of dopants without the diffusion implant mask. Other techniques for forming the diffusion regions may also may useful. The implant dose for the first diffusion region may be from about $1E13-1E15/cm^2$ and that of the second diffusion region may be from about $1E13-1e14/cm^2$. The implantation energy for the first diffusion region may be from <1 KeV to 5 KeV and the implantation energy for the second diffusion region may be from 5 KeV to 30 KeV. Note that implant energy used depends on the species of dopant. It is utmost desirable to achieve a shallow & deeper implant depth on first & second diffusion, respectively. Other implant parameters may also be useful.

An anneal may be performed. The anneal activates the dopants in the first and second diffusion regions to form a p-n junction. The anneal, for example, is performed at a temperature of about 850-1050° C. for about μ-sec-few sec. Alternatively, the anneal may be a rapid thermal anneal (RTA). Other annealing parameters or processes may also be useful.

Figure 5B:
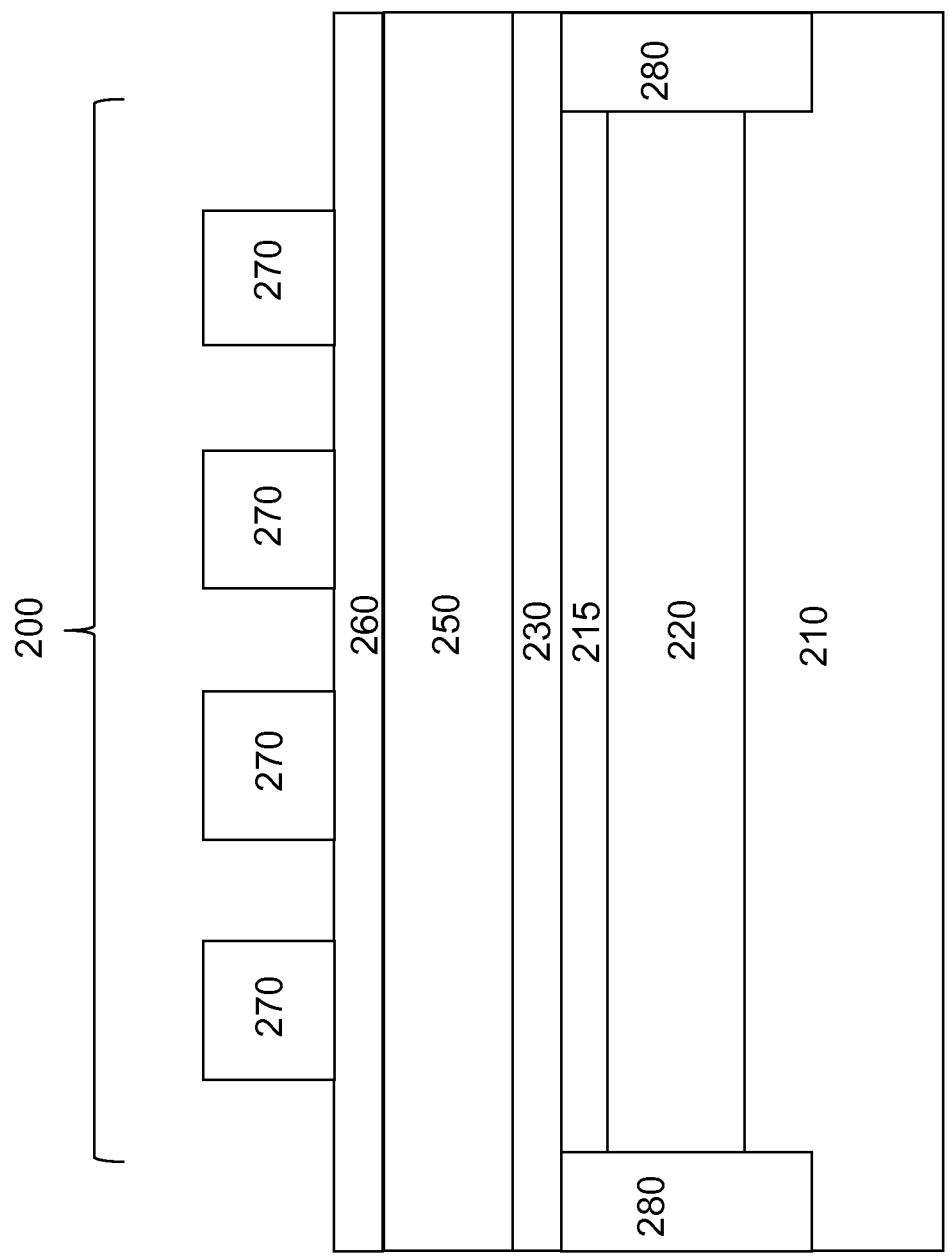

In FIG. 5b, a variable resistance layer 230 is formed on the substrate. Forming a variable resistance layer having multiple variable resistance layers may also be useful. The variable resistance layer is capable of having its resistivity changed in response to an electrical signal. The thickness of the variable resistance layer may be about 10-100 Å. Other variable resistance layer thickness may also be useful. The variable resistance layer may be formed by performing a variety of deposition processes, such as a chemical vapor deposition (CVD) process, an atomic layer deposition (ALD) process, or plasma-enhanced versions of those processes, etc. In one embodiment, the variable resistance layer may be made up of one of the following materials: a perovskite material, such as a colossal magnetoresistive (CMR) material or a high temperature superconducting (HTSC) material, for example $Pr_{0.7}Ca_{0.3}MnO_3$ (PCMO), $Gd_{0.7}CaO_{0.3}BaCo_2O_{5+δ}$. Other possible materials for the variable resistance layer include transition metal oxides such as hafnium oxide, titanium oxide, nickel oxide, tungsten oxide, tantalum oxide, copper oxide, manganites, titanates, zirconates, etc. Other types of variable resistance materials may also be useful.

In one embodiment, a bit line electrode 250 is formed on top of the variable resistance layer 230. The bit line electrode, for example, includes titanium. Other types of line electrode materials such as tantalum, titanium nitride, tantalum nitride, tungsten, platinum, ruthenium, etc., may also be useful. The thickness of the bit line electrode may be about 500-5000 Å. Other bit line electrode thickness may also be useful. The bit line electrode may be formed by a CVD process. Other types of deposition processes may also be useful.

A hard mask layer 260 is formed on the bit line electrode layer 250. The hard mask layer acts as a protective layer of the bit line electrode in a subsequent etching step to define the RRAM devices. The hard mask layer, for example, includes silicon nitride. Other type of hard mask materials may also be useful. The hard mask layer may be formed by a CVD process and the thickness of the hard mask layer may be about 100-1000 Å. Other types of deposition processes and thicknesses of the hard mask layer may also be useful.

The layers having the bit line electrode and variable resistance layers are to be patterned into individual RRAM devices. Conventional techniques, such as mask and etch processes, can be used. In one embodiment, a photoresist layer 270 is formed over the hard mask layer and patterned, exposing portions of the hard mask layer.

Figure 5C:
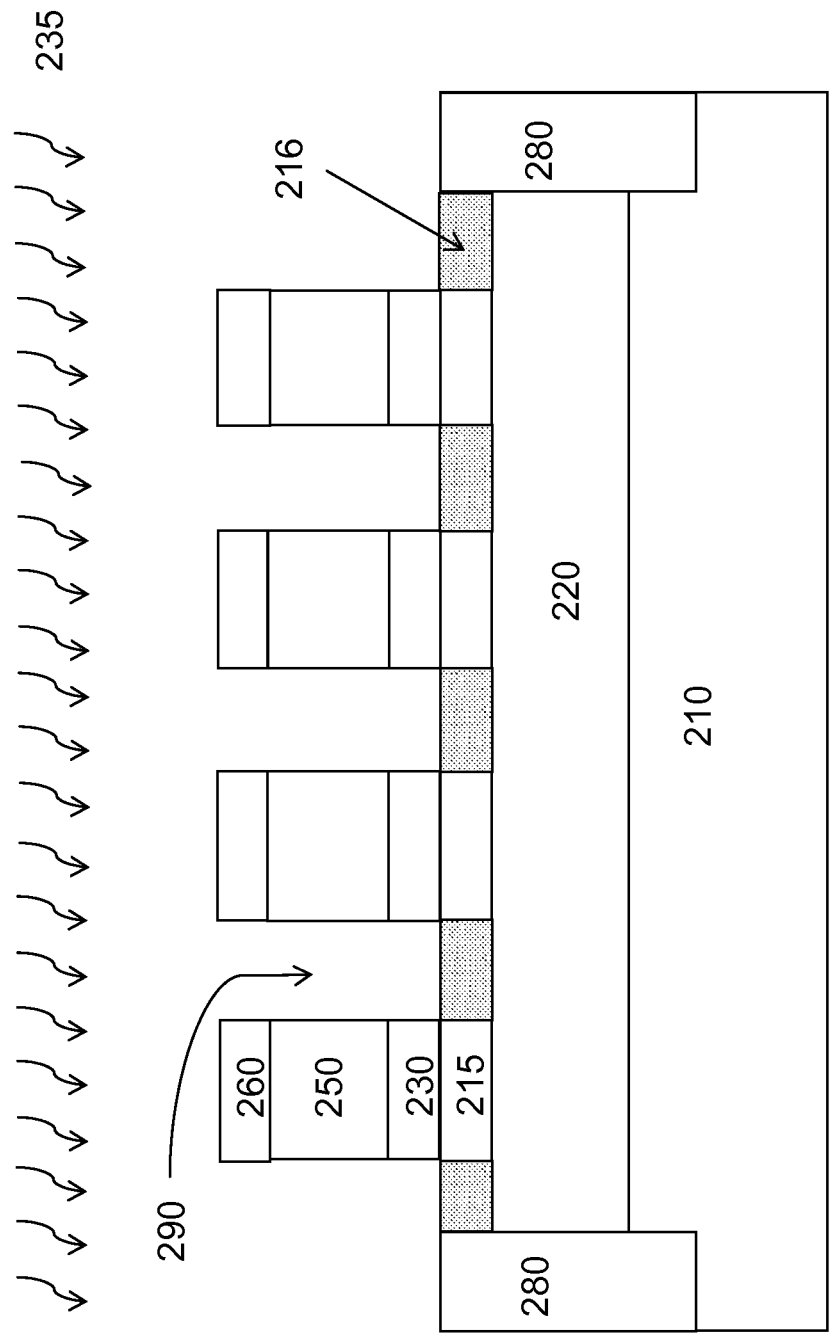

In FIG. 5c, an anisotropic etch, such as reactive-ion-etch (RIE), is performed to remove the exposed portions of the hard mask layer, bit line electrode and the variable resistance layer, to create trenches 290. To improve lithographic resolution, an anti-reflective coating (ARC) can be provided beneath the masking layer 270. Other techniques for patterning the layers may also be useful. A shallow pre-amorphization implant (PAI) 235 is subsequently performed on the exposed first diffusion region, creating amorphized silicon regions 216 within the first diffusion region.

Figure 5D:
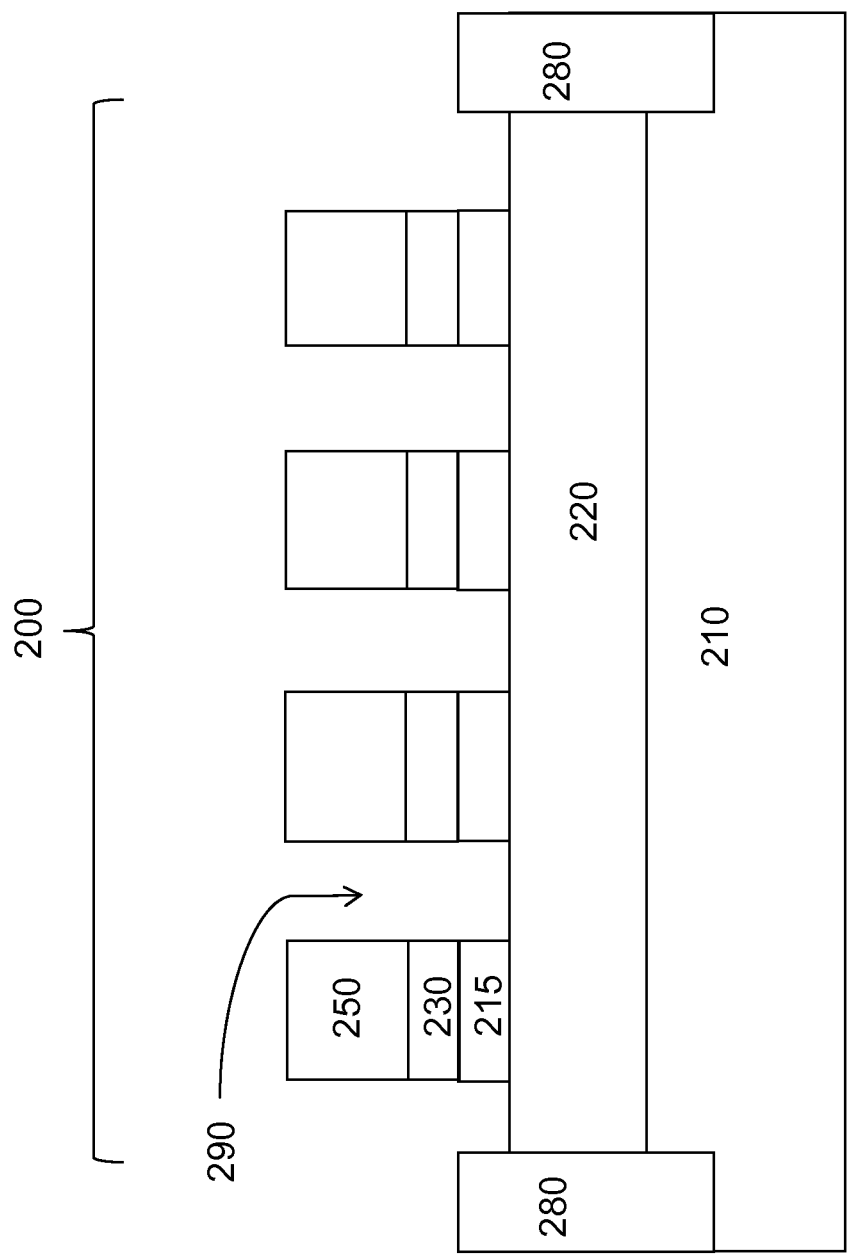

As shown in FIG. 5d, an anisotropic etch, such as reactive-ion-etch (RIE), is performed to remove the amorphized silicon regions 216. The amorphized silicon regions have a different etch rate as compared to the first and second diffusion regions, which are of a monocrystalline silicon structure. This facilitates the removal of the amorphized silicon regions with minimal damage to the unexposed first diffusion region and the underlying second diffusion region.

A wet etching process is subsequently performed to remove the hard mask layer. In one embodiment, the wet etching process may include phosphoric acid which would have a high selectivity with respect to removing silicon nitride as a hard mask layer. Other methods of removing the hard mask layer may also be useful.

Figure 5E:
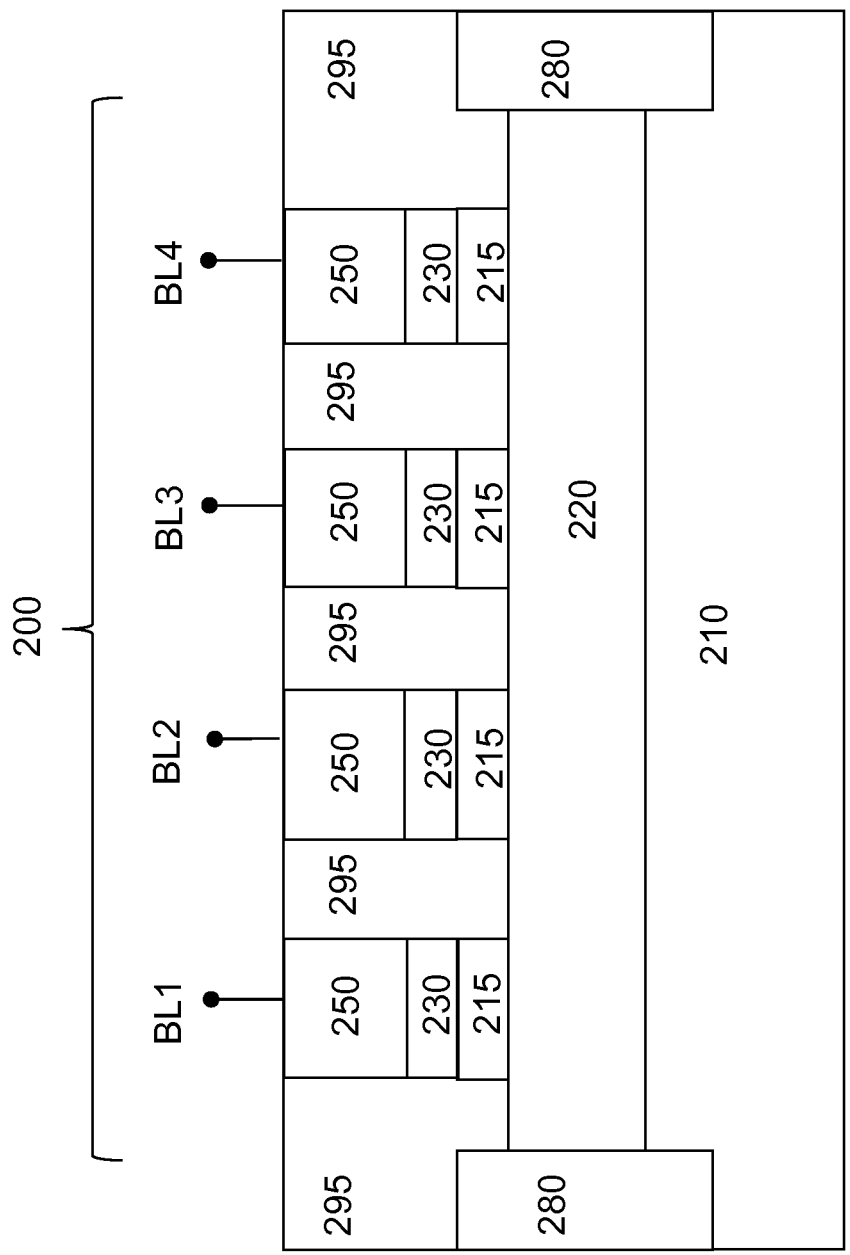

As shown in FIG. 5e, the trenches 290 are filled with dielectric material 295 such as silicon oxide. CMP processes can be performed to remove excess oxide and provide a planar substrate top surface. Other processes or dielectric materials may also be useful.

The memory device 200 is subsequently subjected to any suitable type of silicidation and back-end-of-line processes and will not be further elaborated in this disclosure.

Figure 6A:
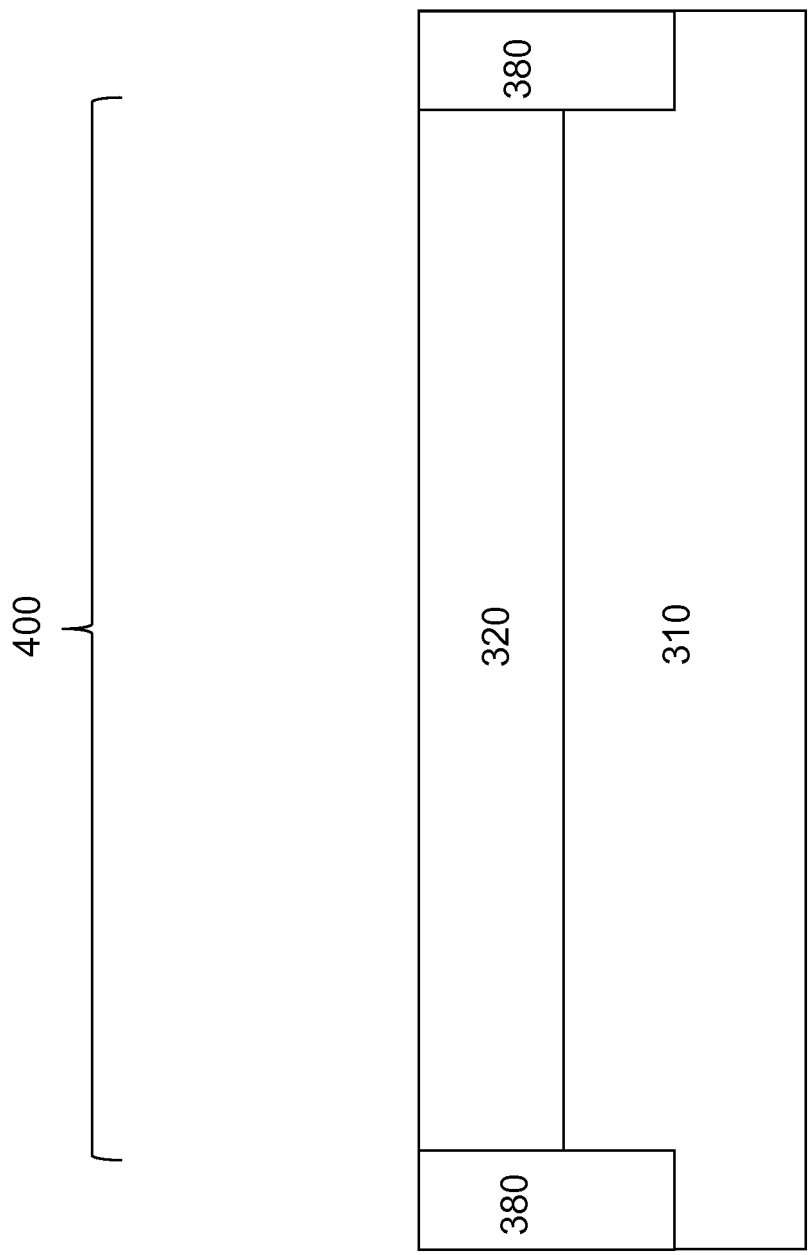
FIGS. 6a-d show the process sequence of the fabrication of a memory device 400 having a plurality of RRAM device 300.

FIGS. 6a-d show cross-sectional views of an embodiment of a process for forming the memory device 400 with a plurality of RRAM devices 300. The process sequence for the fabrication of a memory device with a plurality of RRAM devices is identical to that for a single RRAM device. Referring to FIG. 6a, a substrate 310 is provided. The substrate can include a silicon substrate, such as a lightly doped p-type doped substrate. Other types of substrates, including silicon germanium or silicon-on-insulator (SOI) are also useful.

As shown in FIG. 6a, isolation regions 380 are formed in the substrate. The isolation regions include, for example STIs. Various processes can be employed to form the STI regions. For example, the substrate can be etched using etch and mask techniques to form trenches which are then filled with dielectric materials such as silicon oxide. Chemical Mechanical Polishing (CMP) can be performed to remove excess oxide and provide a planar substrate top surface. Other processes or materials can also be used to form the STIs. The isolation may be other types of isolation regions, for example, Deep Trench Isolation (DTI) regions. The depth of the STIs may be, for example, about 2000-4000 Å. Other depths of STIs may also be useful.

A diffusion region 320 is disposed in the substrate. In one embodiment, the diffusion region includes second polarity type dopants. The depth of the diffusion region, for example, may be in the range of about 0.8-1.8 μm. Providing a diffusion region having other depths may also be useful.

In one embodiment, the diffusion region is heavily doped with a n-type dopant. The diffusion region may be formed by performing multiple implants at different energies. The diffusion region may be formed by implantation of dopants, with or without a diffusion implant mask. In one embodiment, the diffusion region is formed by implantation of dopants without the diffusion implant mask. Other techniques for forming the diffusion regions may also may useful. The implant dose for the diffusion region may be from about 1E13-1E14/cm$^2$ and the implantation energy may be from 5 KeV to 30 KeV. Note that implant energy used depends on the species of dopant. It is utmost desirable to achieve a shallow & deeper implant depth on first & second diffusion, respectively. Other implant parameters may also be useful.

Figure 6B:
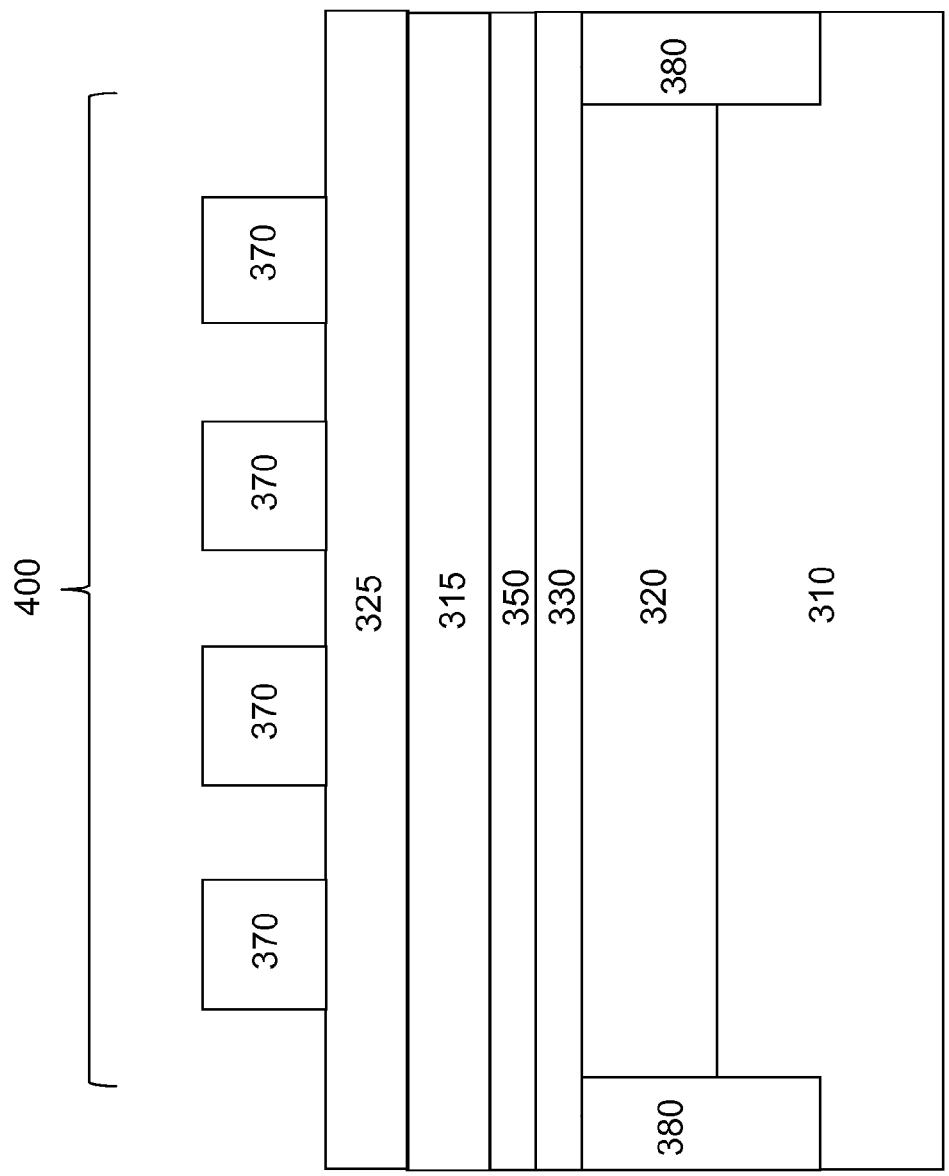

In FIG. 6b, a variable resistance layer 330 is formed on the substrate. Forming a variable resistance layer having multiple variable resistance layers may also be useful. The variable resistance layer is capable of having its resistivity changed in response to an electrical signal. The thickness of the variable resistance layer may be about 10-100 Å. Other variable resistance layer thickness may also be useful. The variable resistance layer may be formed by performing a variety of deposition processes, such as a chemical vapor deposition (CVD) process, an atomic layer deposition (ALD) process, or plasma-enhanced versions of those processes, etc. In one embodiment, the variable resistance layer may be made up of one of the following materials: a perovskite material, such as a colossal magnetoresistive (CMR) material or a high temperature superconducting (HTSC) material, for example $Pr_{0.7}Ca_{0.3}MnO_3$ (PCMO), $Gd_{0.7}CaO_{0.3}BaCo_2O_{5+\delta}$. Other possible materials for the variable resistance layer include transition metal oxides such as hafnium oxide, titanium oxide, nickel oxide, tungsten oxide, tantalum oxide, copper oxide, manganites, titanates, zirconates, etc. Other types of variable resistance materials may also be useful.

In one embodiment, a bit line electrode 350 is formed on top of the variable resistance layer 330. The bit line electrode, for example, includes titanium. Other types of line electrode materials such as tantalum, titanium nitride, tantalum nitride, tungsten, platinum, ruthenium, etc., may also be useful. The thickness of the bit line electrode may be about 100-500 Å. Other bit line electrode thickness may also be useful. The bit line electrode may be formed by a CVD process. Other types of deposition processes may also be useful.

A first semiconductor layer 315 is formed on top of bit line electrode 350. The first semiconductor layer, for example, includes a semiconductor material. In one embodiment, the first semiconductor material includes polysilicon in-situ doped with a first polarity type dopant. Other type of semiconductor materials may also be useful. The first semiconductor layer may be formed by a CVD process and the thickness of the first semiconductor layer may be about 100-2000 Å. Other types of deposition processes and thicknesses of the first semiconductor layer may also be useful.

A second semiconductor layer 325 is subsequently formed on top of the first semiconductor layer 315. The second semiconductor layer, for example, includes a semiconductor material. In one embodiment, the second semiconductor material includes polysilicon in-situ doped with a second polarity type dopant. Other type of semiconductor materials may also be useful. The second semiconductor layer may be formed by a CVD process and the thickness of the second semiconductor layer may be about 100-2000 Å. Other types of deposition processes and thicknesses of the second semiconductor layer may also be useful.

The layers having the first and second semiconductor layers, bit line electrode and variable resistance layers are to be patterned into individual RRAM devices. Techniques, such as mask and etch processes, can be used. In one embodiment, a photoresist layer 370 is formed over the second semiconductor layer and patterned, exposing portions of the second semiconductor layer.

Figure 6C:
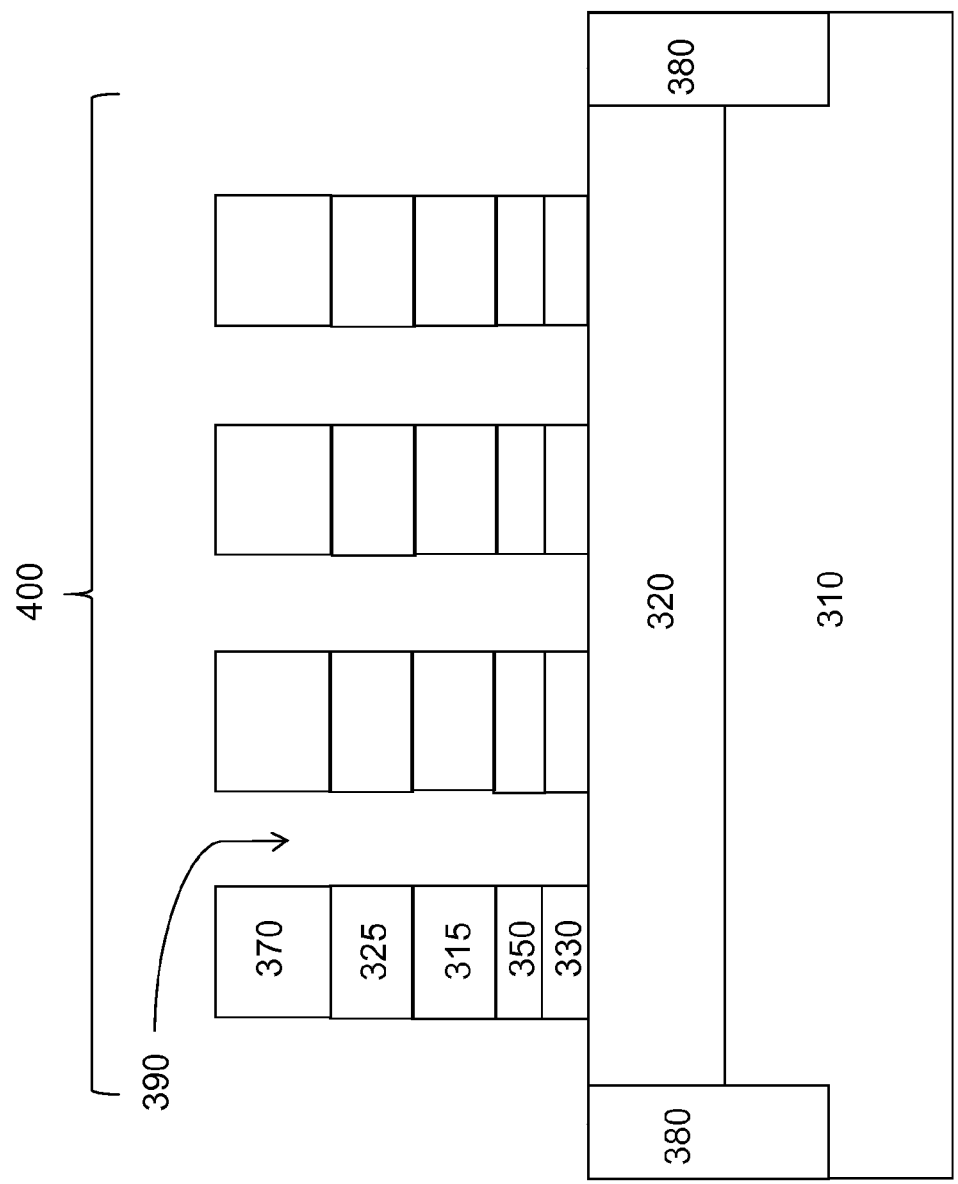

In FIG. 6c, an anisotropic etch, such as reactive-ion-etch (RIE), is performed to remove the exposed portions of the first and second semiconductor layers, bit line electrode and the variable resistance layer, to create trenches 390. To improve lithographic resolution, an anti-reflective coating (ARC) can be provided beneath the masking layer 370. Other techniques for patterning the layers may also be useful.

Figure 6D:
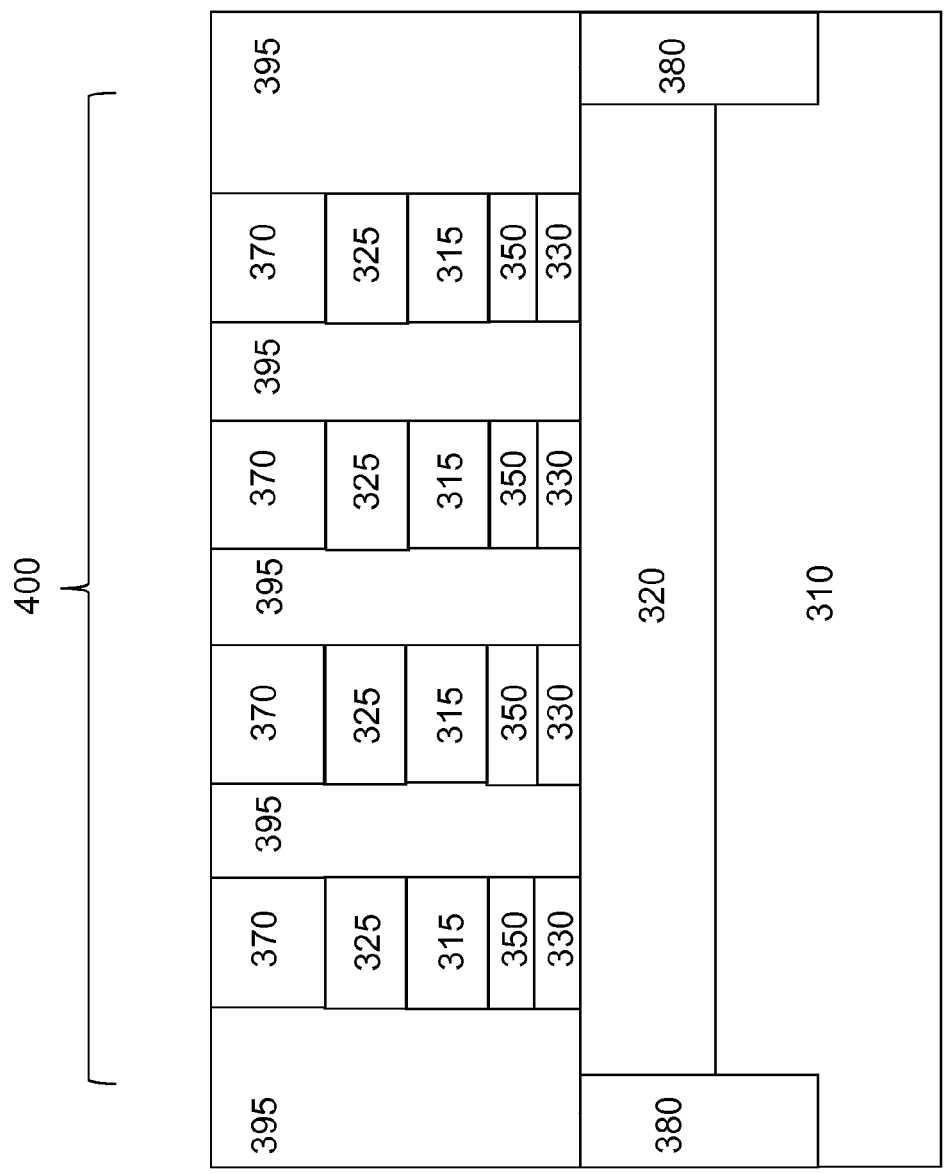

As shown in FIG. 6d, trenches 390 are filled with dielectric material 395 such as silicon oxide. CMP processes can be performed to remove excess oxide and provide a planar substrate top surface. Other processes or dielectric materials may also be useful.

The memory device 400 is subsequently subjected to any suitable types of silicidation and back-end-of-line processes and will not be further elaborated in this disclosure.

Figure 7A:
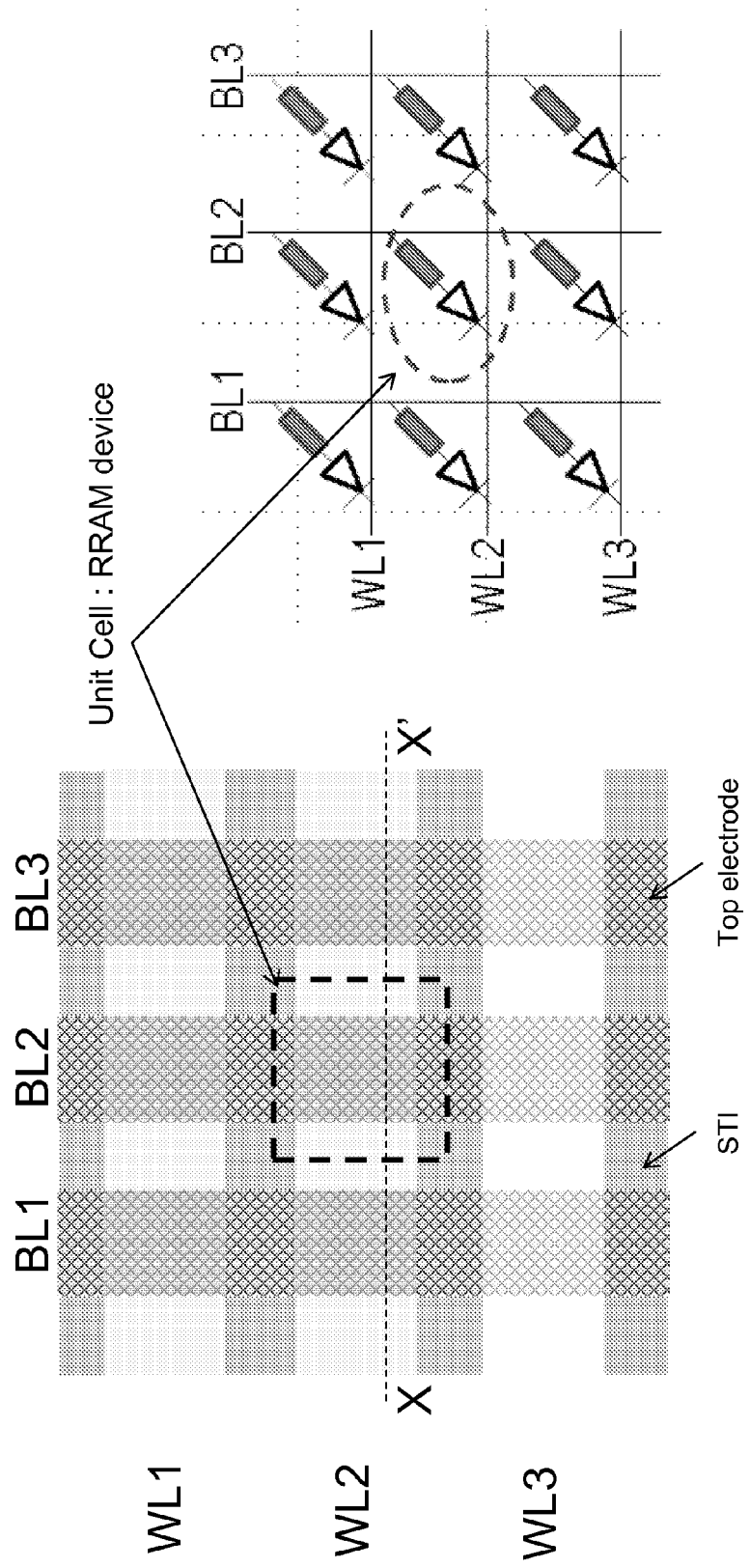
FIGS. 7a-b show various illustrative operational aspects of one embodiment of a novel RRAM device disclosed herein.

In FIG. 7a, an exemplary top view and corresponding electrical schematics of memory device 200 with an array of RRAM devices are shown with three bit lines (BL1, BL2 and BL3) and three word lines (WL1, WL2 and WL3).

Figure 7B:
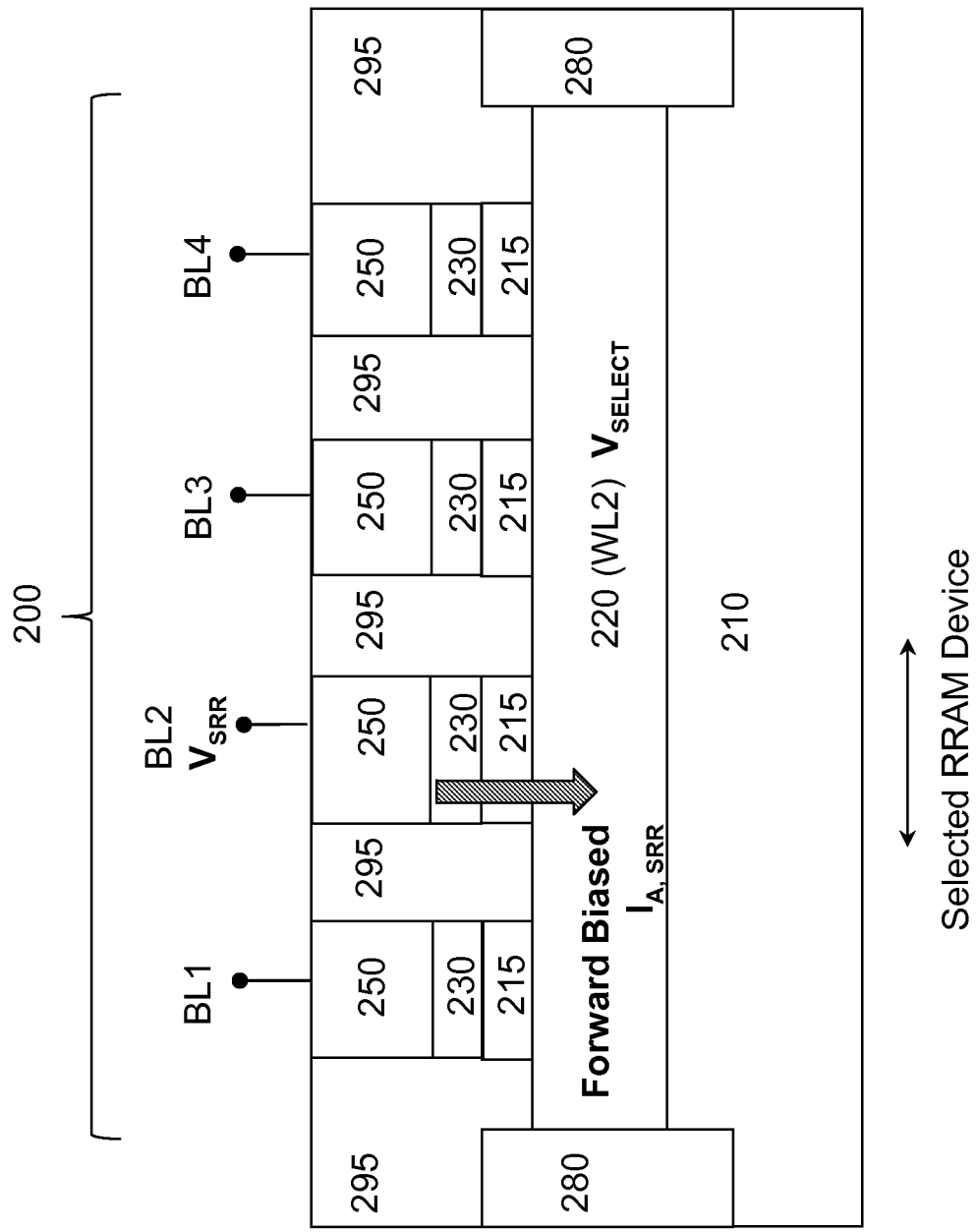

FIG. 7b shows the cross section of the memory device along the X-X' direction in FIG. 7a. The RRAM device with BL2 and WL2 is selected for illustrative purposes. Three illustrative voltages are indicated: 1) $V_{SRR}$—the voltages applied during a SET, RESET or READ; 2) $V_{SELECT}$—the voltage applied to the word line to select and activate the word line; and 3) $V_{FLOAT}$—no voltage is applied. The magnitude and/or polarity of these voltages may vary depending on the particular RRAM device at issue. To perform a SET, RESET or READ operation, $V_{SRR}$ is applied to BL2 and $V_{SELECT}$ is applied to WL2. BL1, BL3, WL1 and WL2 are left floating wherein $V_{SRR}$ is at a more positive bias than $V_{SELECT}$. This produces a current $I_{A, SRR}$ to flow through the variable resistance layer, causing the resistivity of the variable resistance layer to change. This change in the state of resistance can be used to indicate the presence or absence of a bit of information. In this illustrative embodiment, each bit line is separated by a dielectric material and each word line is separated by a STI region and a RRAM device is formed where each bit line and word line intersect. Contacts are only being made, for example, at the ends of the bit lines and word lines. Thus each of the RRAM devices in the memory device 200 has the capability to store bits of information without the need for specific contacts to each of the devices.

The following table generally set forth one example of the various voltages that may be applied to select ('Sel') or unselect ('UnSel') a bit line (BL) and a word line (WL) depending on the particular operation to be performed.

|           | BL          |       | WL        |       |
|-----------|-------------|-------|-----------|-------|
| Operation | Sel         | UnSel | Sel       | UnSel |
| FORMING   | $V_{form, hi}$  | Float | $V_{sel}$ | Float |
| READ      | $V_{read, hi}$  | Float | $V_{sel}$ | Float |
| SET       | $V_{set, hi}$   | Float | $V_{sel}$ | Float |
| RESET     | $V_{reset, hi}$ | Float | $V_{sel}$ | Float |

The embodiments described above are highly compatible with IC fabrication processes. For example, the embodiments described are highly compatible with processes which form semiconductor devices.

The invention may be embodied in other forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A RRAM device, comprising:
a substrate prepared with a diffusion region having first polarity type dopants in the substrate;
a conductive bit line electrode disposed over the substrate;
first and second semiconductor layers disposed over the conductive bit line electrode, wherein the first semiconductor layer is positioned between the conductive bit line electrode and the second semiconductor layer;
a variable resistance layer positioned between the conductive bit line electrode and the diffusion region, wherein the variable resistance layer directly contacts a top surface of the diffusion region; and
a single isolation layer disposed on and contacts the substrate, wherein the single isolation layer contacts exposed portions of the diffusion region and sidewalls of the first and second semiconductor layers, conductive bit line electrode and variable resistance layer.

2. The device in claim 1 wherein:
the first semiconductor layer comprises second polarity type dopants; and
the second semiconductor layer comprises first polarity type dopants, wherein the first and second semiconductor layers form a diode device coupled to the conductive bit line electrode.

3. The device in claim 1, wherein the diffusion region comprises a conductive word line conductively coupled to the variable resistance layer.

4. The device in claim 1 wherein the variable resistance layer comprises a perovskite material.

5. The device in claim 1, wherein said variable resistance layer comprises a plurality of variable resistance layers.

6. A memory device, comprising:
a substrate with alternating strips of active and isolation regions; and
a plurality of RRAM devices overlapping the active regions, wherein each of the RRAM device comprises
a bit line electrode disposed over the substrate,
first and second semiconductor layers disposed over the bit line electrode, wherein the first semiconductor layer is positioned between the bit line electrode and the second semiconductor layer, and
a variable resistance layer positioned between the bit line electrode and the active region, wherein
the variable resistance layer directly contacts a top surface of the active region in the substrate;
wherein each of the isolation regions is a single isolation layer which is disposed on and contacts exposed portions of the substrate and sidewalls of the first and second semiconductor layers, bit line electrode and variable resistance layer.

7. The device in claim 6 wherein the first semiconductor layer comprises first polarity type dopants and the second semiconductor layer comprises second polarity type dopants opposite to the first polarity type.

8. The device in claim 7, wherein the first and second semiconductor layers form a diode device coupled to the bit line electrode.

9. The device in claim 7 further comprises a diffusion region in the active regions in the substrate, wherein the diffusion region comprises a conductive word line coupled to the variable resistance layer.

10. The device in claim 6, wherein the variable resistance layer comprises a plurality of variable resistance layers.

11. A memory cell comprising:
a substrate;
a diffusion region having first polarity type dopants disposed in the substrate;
a storage layer disposed on the diffusion region, wherein the storage layer is in direct contact with a top surface of the diffusion region, the storage layer comprises variable resistance material;
a top electrode on the storage layer, wherein the storage layer is in direct contact with a bottom surface of the top electrode;
first and second semiconductor layers disposed over the top electrode, wherein the first semiconductor layer is positioned between the top electrode and the second semiconductor layer; and
a single isolation layer disposed on the substrate, wherein the single isolation layer contacts exposed portions of the diffusion region and sidewalls of the top electrode and storage layer.

12. The memory cell of claim 11 wherein the first semiconductor layer comprises second polarity type dopants and the second semiconductor layer comprises first polarity type dopants, wherein the first and second semiconductor layers form a diode device coupled to the top electrode.

13. The memory cell of claim 11 wherein the variable resistance material is a perovskite material.

14. A memory device comprising:
a substrate prepared with a diffusion region in the substrate;
a top electrode disposed over the substrate and above the diffusion region;
first and second semiconductor layers disposed over the top electrode, wherein the first semiconductor layer separates the top electrode and the second semiconductor layer, the first semiconductor layer is in direct contact with a top surface of the top electrode;
a storage layer disposed between the top electrode and the diffusion region, wherein the storage layer directly contacts a top surface of the diffusion region; and
an isolation layer disposed over the substrate, wherein the isolation layer contacts exposed sidewalls of the storage layer, top electrode and first and second semiconductor layers.

15. The memory device of claim 14 wherein:
the first semiconductor layer comprises first polarity type dopants; and
the second semiconductor layer comprises second polarity type dopants opposite to the first polarity type.

16. The memory device of claim 15 wherein the first and second semiconductor layers form a diode device coupled to the top electrode.

17. The memory device of claim 16 wherein the top electrode is a bit line electrode disposed on and in direct contact with a top surface of the storage layer.

18. The memory device of claim 14 wherein the diffusion region comprises a conductive word line coupled to the storage layer.

19. The memory device of claim 14 wherein the storage layer comprises perovskite material.

20. The memory device of claim 14 wherein the isolation layer is a single dielectric layer.

* * * * *